(12) United States Patent
Fussell et al.

(10) Patent No.: US 6,946,843 B2
(45) Date of Patent: Sep. 20, 2005

(54) TEST PADDLE HAVING A UNIVERSAL BINDING POST

(75) Inventors: Howard G. Fussell, Duncanville, TX (US); John Charles Hicks, Waxahachie, TX (US); Eddie Bouasry, Arlington, TX (US)

(73) Assignee: AVO Multi-Amp Corporation, Dallas, TX (US)

( * ) Notice: Subject to any disclaimer, the term of this patent is extended or adjusted under 35 U.S.C. 154(b) by 0 days.

(21) Appl. No.: 10/690,333

(22) Filed: Oct. 21, 2003

(65) Prior Publication Data

US 2004/0087205 A1 May 6, 2004

Related U.S. Application Data

(60) Provisional application No. 60/419,922, filed on Oct. 21, 2002.

(51) Int. Cl.[7] .............................................. G01R 31/327
(52) U.S. Cl. ...................................................... 324/418
(58) Field of Search ................................ 324/418, 508; 439/482

(56) References Cited

U.S. PATENT DOCUMENTS

| | | | | |
|---|---|---|---|---|
| 3,282,096 A | | 11/1966 | Bullard et al. ................. 73/161 |
| 3,355,659 A | | 11/1967 | Burgess ......................... 324/28 |
| 3,922,600 A | | 11/1975 | Roveti .......................... 324/51 |
| 5,149,278 A | * | 9/1992 | Waas et al. .................. 439/412 |
| 5,713,765 A | * | 2/1998 | Nugent ........................ 439/700 |
| 6,025,760 A | * | 2/2000 | Tang ........................... 333/100 |
| 6,685,483 B2 | * | 2/2004 | Blauvelt ....................... 439/43 |
| 2003/0100219 A1 | * | 5/2003 | Dickens ....................... 439/491 |

OTHER PUBLICATIONS

Surplus Sales of Nebraska, *Binding Posts*, Nov. 3, 2002, 2 pages, www.surplussales.com website.

* cited by examiner

Primary Examiner—Vincent Q. Nguyen
Assistant Examiner—M. Kramskaya
(74) Attorney, Agent, or Firm—Conley Rose, P.C.; J. Robert Brown, Jr.

(57) ABSTRACT

A testing device for connection to a relay is provided. The testing device comprises a binding post and a test paddle. The test paddle includes a body portion, a stud, a contact and a handle. The body portion has a stud opening, a contact opening associated with the stud opening and a barrier extending from a first end of the body. The contact extends through the contact opening and is electrically coupled to the stud. The handle is coupled to the body and configured for grasping by an individual's hand to promote insertion and removal of the test paddle from the relay. The binding post includes a cover configured for rotating the binding post, the cover having an inner chamber for receiving an insert of the binding post. The insert is configured to couple test equipment to the stud on the test paddle for testing relay switches.

5 Claims, 4 Drawing Sheets

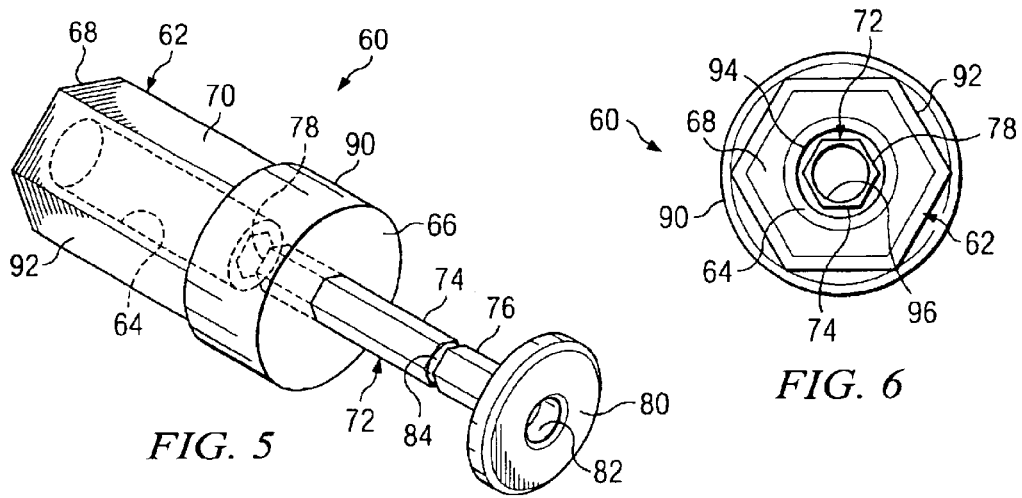
FIG. 5
FIG. 6
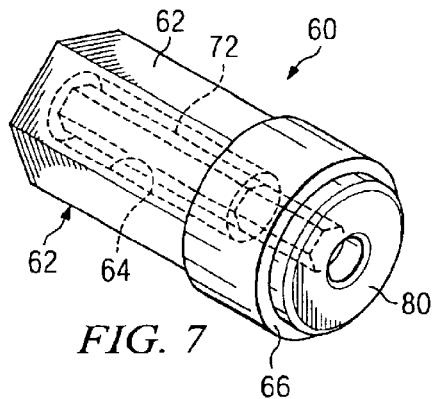
FIG. 7
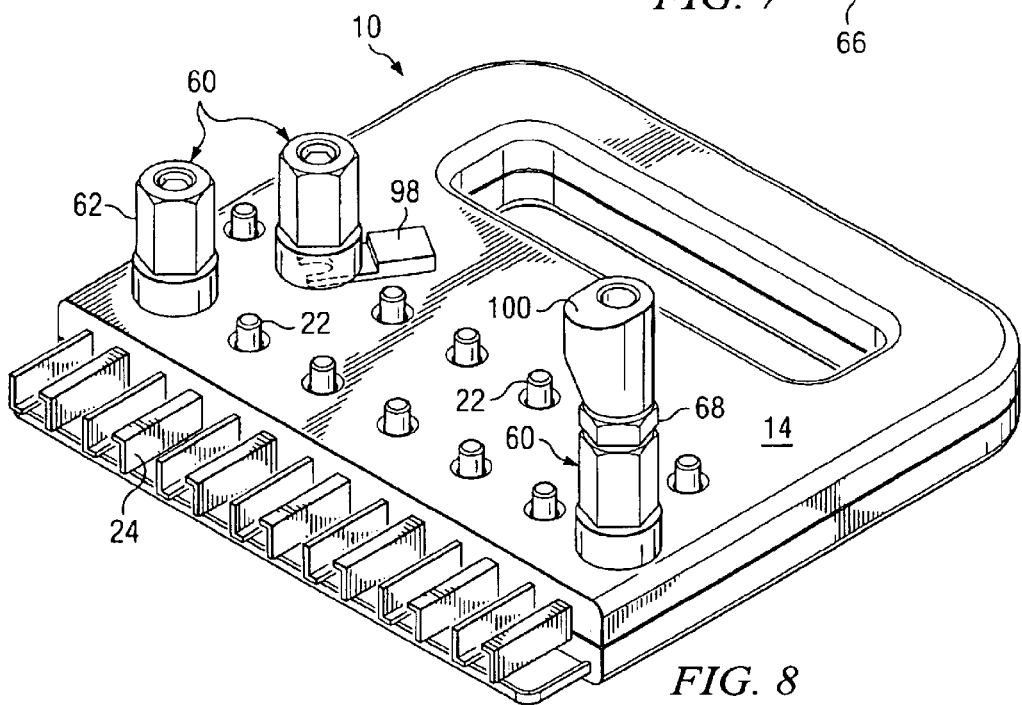
FIG. 8

TEST PADDLE HAVING A UNIVERSAL BINDING POST

CROSS-REFERENCE TO RELATED APPLICATIONS

This application is related to U.S. Provisional Patent Application Ser. No. 60/419,922 entitled "Test Paddle Having A Universal Binding Post", filed on Oct. 21, 2002.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD OF THE INVENTION

This present disclosure relates in general to the field of testing devices and more particularly, but not by way of limitation, to a test paddle having a universal binding post.

BACKGROUND OF THE INVENTION

Switches and relays are frequently tested to ensure they are functioning properly and for a number of other reasons. A variety of test equipment is utilized for these purposes, such as test boards that include a plurality of contacts that may be plugged into a relay for testing the switches of the relay. Binding posts on the test board communicate with the contacts. Binding posts, such as the 5-way binding post constructed by Superior Electric of Bristol, Conn., provide an attachment point for connecting test equipment.

Unfortunately, current binding posts and test boards have a number of shortcomings that provide the test boards and binding posts with limited versatility and make them difficult to use. For this reason, a need exists for an improved test board and binding post that overcome these and other disadvantages of previous test boards and binding posts.

SUMMARY OF THE INVENTION

The present disclosure provides a testing device for connection to a relay for testing the relay, the testing device comprises a test paddle and a binding post. The test paddle includes a body portion, a stud, a contact and a handle. The body portion has an upper surface defining a stud opening, a lower surface, a first end having a contact opening associated with the stud opening and a barrier extending from the first end of the body.

The stud extends through the stud opening on the upper surface of the body portion. The contact extends through the contact opening on the first end of the body portion. The contact is electrically coupled to the stud. The handle is coupled to the body and is configured for grasping by the hand of an individual to promote insertion and removal the test paddle from the relay.

The binding post includes a cover having a first end, a second end, an inner chamber extending from the first end to the second end of the cover and an outer surface configured to promote rotation of the cover. An insert of the binding has a shaft coupleable to the inner chamber of the cover. A first end of the shaft is configured to couple with the stud on the test paddle.

In one embodiment, the present disclosure provides a test paddle for use with any bind post or stud. In this embodiment, the stud of the test paddle is a binding post having a threaded portion extending from one end of the binding post and wherein the stud opening is threaded to threadingly receive the threaded portion of the binding post. In other embodiments, the stud is a threaded stud, such as a 0.375 units long 10-32 stud.

In one embodiment, the stud opening extends through the body portion from the first surface to the second surface the wherein the stud couples to the contact. In this embodiment, the inner chamber between first and second sides is provided with a retaining wall adjacent stud opening to receive a portion of the contact.

In other embodiments, the test paddle may be provided with a plurality of stud openings configured to receive a plurality of studs, a plurality of contact openings wherein each of the plurality of contact openings are associated one of the plurality of stud openings. Each of the plurality of studs coupleable to one of the contacts.

In one embodiment, the handle is provided on a second end of the body portion. In another embodiment, the second end defines a handle opening configured to receive the hand of a user. The upper and lower surfaces may be knurled about edges of the upper and lower surfaces, as well as about the opening defining the handle.

The test paddle of the present disclosure is that the handle promotes easy insertion and removal of the test paddle with the switch or relay for testing. Current test boards are constructed in a box-like configuration that is difficult to grasp and manipulate. Utilizing the test paddle of the present disclosure, the user is better able to control the test paddle, which promotes safety and ease of use. Also, studs of various configurations, whether or not threaded, may be received into the openings to connect to the binding posts. Thus, the configuration of the test paddle provides more versatility.

In yet another embodiment, the present disclosure provides a binding post for use with the test paddle of the present disclosure as well as other devices. The shaft of the insert of the binding post further provided with a shoulder coupled to the first end of the shaft extending about the first end of the cover. The shoulder having a diameter greater than a diameter of the first end of the shaft.

In one embodiment, the cover of the binding is constructed of an insulating material, such as ABS plastic. The insert is constructed of material to promote electrical conductivity such that the first end of the insert is in electrical communication with the second end of the insert. In one embodiment, the insert is sized to be received into the inner chamber of the cover.

In other embodiments, the binding is provided with a gap between a sidewall defining the inner chamber of the cover adjacent the second end of the cover and the second end of the shaft of the insert, wherein an insulating sleeve is disposed in the gap between the sidewall of the inner chamber of the cover and the second end of shaft of the insert. In some embodiments, the second end of the binding post is adapted to receive a banana jack, while in others, the second end of the binding post is adapted to receive a shielded or safety banana jack for testing and other purposes.

In still other embodiments, a portion of the cover is hex shaped to promote rotation of the cover, while in others, a portion of the cover box shaped to promote rotation of the cover. In others embodiments, an outer surface of the cover is angularly configured to receive a tool and angularly configured to promote rotation by the hand of an individual.

The inner chamber of the cover of the binding post is angularly configured to receive an angularly configured outer surface of the insert such that rotation of the cover effects rotation of the insert to threading engage and disengage the insert from the stud on the test paddle. The insert is configured to be received in the inner chamber of the cover.

The inner chamber of the insert may be provided with a ring disposed between the first and second ends of the cover. The ring extending circumferentially about the inner chamber and the outer surface of the insert is provided with an annular recess positioned to be received by the ring of the inner chamber to couple the insert to the cover and inhibit removal of the cover from the insert.

Current binding posts are provided with a threaded shaft to achieve a somewhat permanent connection or are otherwise configured in a manner limiting the type of electrical connection that can be made to the binding post. The binding post of the present disclosure is configured to quickly and easily receive a spade lug, ring lug, regular, shielded or safety banana jack. In this manner the binding post is universal to the testing apparatuses that may be readily coupled to the binding post and test paddle for testing switches or relays.

The insulated cover promotes safety while the configuration of the cover promotes easy connection of the binding post to the test paddle and connection of test equipment, via banana jacks, for example, to the binding post. The configuration of the cover further promotes loosening and tightening of the binding post to the test paddle for connecting spade and ring lugs.

Other technical advantages are readily apparent to one skilled in the art from the following figures and description.

BRIEF DESCRIPTION OF THE DRAWINGS

For a more complete understanding of the present disclosure and the advantages thereof, reference is now made to the following brief description, taken in connection with the accompanying drawings and detailed description, wherein like reference numerals represent like parts, in which:

FIG. 5 is a perspective view of a binding post having an insert and a cover constructed according to one embodiment of the present disclosure;

FIG. 6 is a top view of the binding post illustrated in FIG. 5 detailing a coupling for receiving a banana jack;

FIG. 7 is a perspective view of the binding post shown in FIG. 5 illustrating the insert positioned within the cover of the binding post; and FIG. 8 is a perspective view, according to one embodiment, of the binding post illustrated in FIG. 7 shown coupled to the test paddle illustrated in FIG. 1.

DETAILED DESCRIPTION OF THE INVENTION

It should be understood at the outset that although exemplary implementations of a test paddle and a universal binding post are illustrated below, the present disclosure may be implemented using any number of techniques, whether currently known or in existence. The present disclosure should in no way be limited to the exemplary implementations, drawings, and techniques illustrated below, including the exemplary design and implementation illustrated and described herein.

Figure 1:
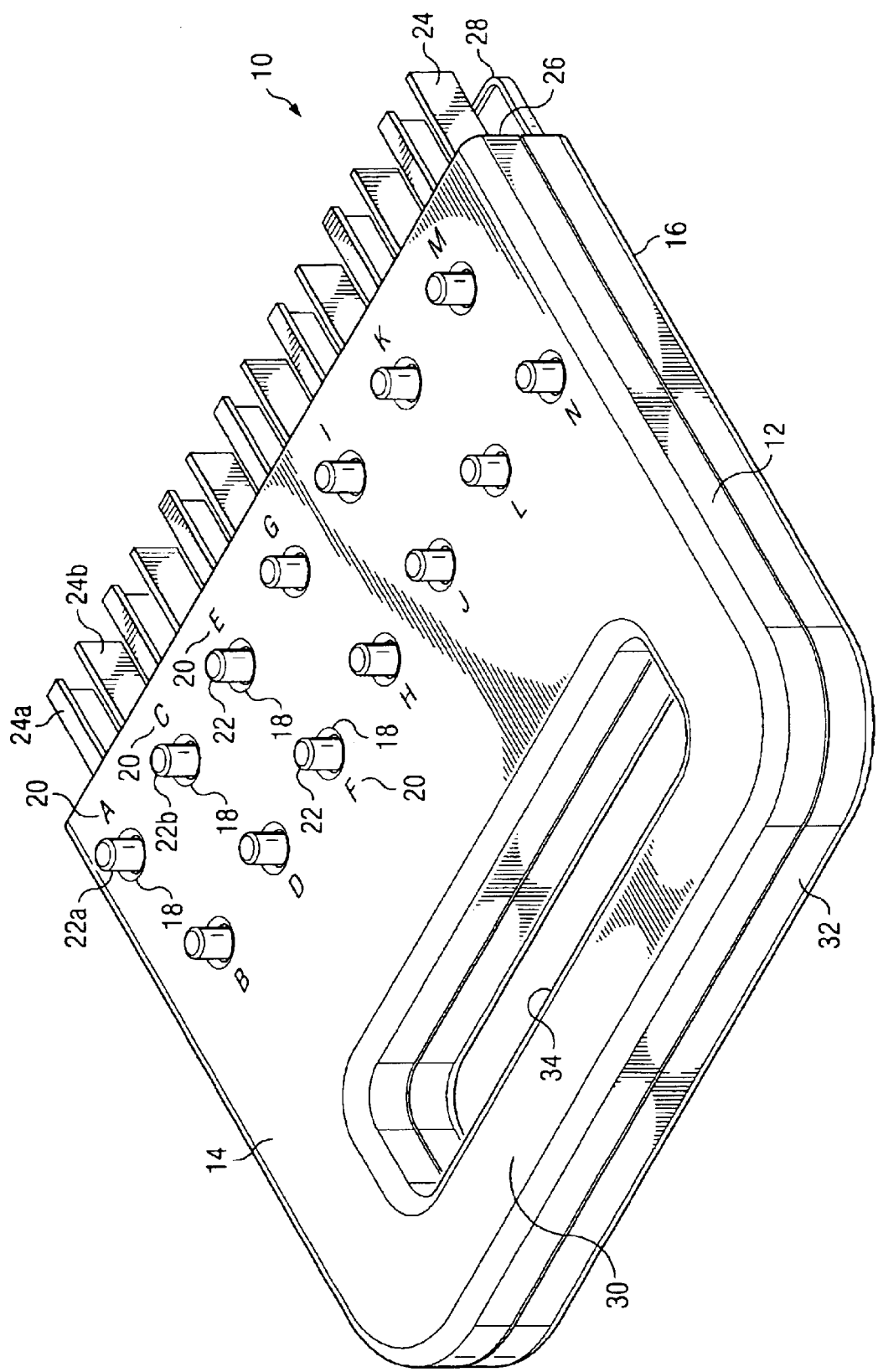
FIG. 1 is a perspective view of a test paddle constructed in accordance with one embodiment of the present disclosure.

FIG. 1 illustrates one embodiment of a test paddle 10 for connecting to relays for testing the switches of the relay. The test paddle 10, in this embodiment, includes a body portion 12 having an upper surface 14 and a lower surface 16. The body portion may be constructed of a non-conductive or insulating material, such as ABS Plastic, or other plastic or polymeric materials, for example polyolefin rubber. The upper surface 14 defines a plurality of stud openings 18 through which studs 22 extend. The stud openings 18 are sized sufficient to receive the studs 22. Indicia 20 is provided on the upper surface 14 of the body portion 12 adjacent the stud openings 18 to identify, for example numerically or alphanumerically designated or color-coded, the various studs 22.

The plurality of studs 22 are illustrated extending through the stud openings 18 on the upper surface 14 of the body portion 12. The test paddle 10 further includes a plurality of contacts 24 extending from a first end 26 of the body portion 12. In the present embodiment, the contacts 24 are rigid knife-type contacts, but other configurations may be suitable as well. The contacts 24 are constructed of electrically conductive material and are electrically coupled the studs 22. For example, contact 24a is electrically coupled to stud 22a, while contact 24b is electrically coupled to stud 22b, and so on.

The studs 22 may include a threaded portion and are constructed of electrically conductive material as well. The studs 22 are provided as a point of connection for binding posts (described hereafter) and testing devices for testing switches of a relay. In other embodiments (not shown), the stud openings 18 may be larger, deeper, or both and the studs 22 may be recessed below the upper surface 14 of the body portion 12. This configuration may be useful to protect the studs 22 when they are not being used and to provide a more sound connection of the binding post to the test paddle 10, for example.

In any event, the test paddle 10 connects to standard relays (not shown) by inserting the contacts 24 into the relay. Once connected, each contact 24, such as contact 24a, is associated with a switch of the relay. The switch associated with contact 24a is readily tested by connecting test equipment to stud 22a which is associated with contact 24a, and so on.

In the illustrated embodiment, the test paddle 10 is provided with a barrier 28 extending from the first end 26 of the body portion 12. The barrier 28 is useful for preventing electrical arching while testing relays. The barrier 28 may also be useful, for example, for preventing objects from touching the contact 24 and to provide additional connection support for the test paddle 10. In other embodiments, the barrier 28 may not be employed at all or may be sized and configured differently to accommodate relays of various shapes or for other considerations.

The test paddle 10 is provided with a handle 30 adjacent the second end 32 of the body portion 12. In the present illustration, the second end 32 of the body portion 12 defines an opening 34 sized to receive at least a portion of a hand of an individual for grasping the test paddle 10 to promote insertion and removal of the test paddle 10 from the relay.

It should be appreciated that the contacts 24 of the test paddle 10 typically couple to the relay in a rigid, frequently high tension or compression manner, which makes insertion and removal of the test paddle 10 difficult. The handle 30 provides a useful means of inserting and removing the test paddle 10 from the relay.

Figure 2:
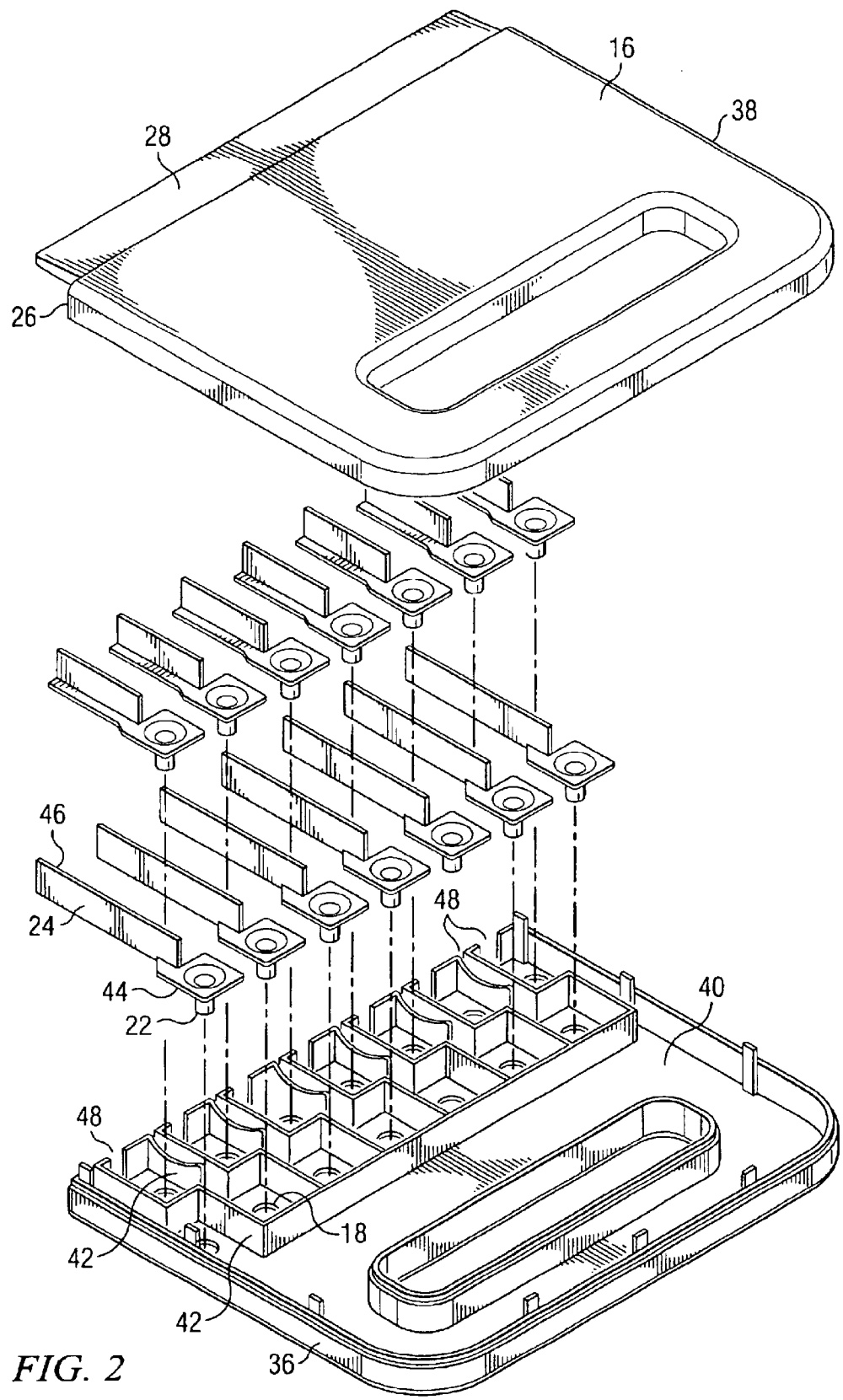
FIG. 2 is a perspective view of the test paddle shown in FIG. 1 illustrating one embodiment of the connection of a plurality of contacts to a body portion of the test paddle.

FIG. 2 illustrates one embodiment of the test paddle 10 wherein the body portion 12 is provided with an upper member 36 and a lower member 38 coupleable to one another to form the body portion 12. The upper and lower members 36 and 38 may be joined in a number of ways including by using adhesive material, for example. It will be appreciated that in other embodiments, such as illustrated in FIG. 1, the body portion 12 may be constructed as a substantially unitary member.

However, in the present illustration, the test paddle 10 is configured such that the coupling of the upper and lower members 36 and 38 define an inner chamber 40 of the body portion 12. In this embodiment, a plurality of retaining walls 42 are provided in the inner chamber 40 about the stud openings 18 to receive a portion 44 of the contacts 24. A plurality of contact openings 48 are provided on the first end 26 of the body portion 12 such that a blade portion 46 of the contact 24 extends from the body portion 12 for connection to the relay.

In the embodiment illustrated in FIG. 2, the studs 22 may be a standard bolt or stud threaded and sized to extend through the stud opening 18 for connection to the contacts 24. This configuration allows for more versatility with respect to the various studs 22 that may be used for the test paddle 10. In the present embodiment, a number 10-32 stud having a threaded end extending from the upper surface 14 of the upper member 36 is provided. In other embodiments, the contacts 24 may be provided with a stud 22 integral to the contact 24 such that when a portion of the contact is disposed in the inner chamber 40, the stud 22 extends through the stud opening 18. The present disclosure should not be limited to the particular type of stud 22 or connection or configuration of the studs 22 and/or the contacts 24.

Figure 3:
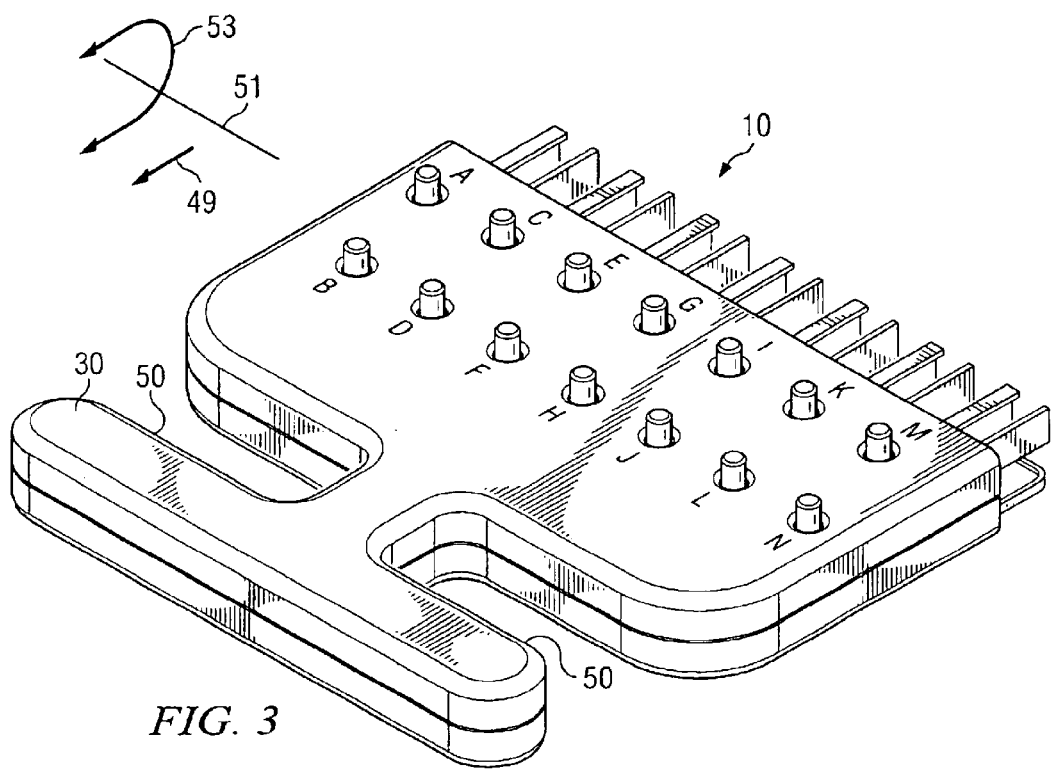
FIG. 3 is a perspective view of the test paddle according to one embodiment illustrating a handle for grasping the test paddle.

FIG. 3 illustrates another embodiment of the handle 30 of the test paddle 10. In this view, the body portion 12 is configured with a plurality of grasping points 50 for grasping by the hand or hands of an individual for obtaining more leverage while inserting and removing the test paddle 10 from the relay. The grasping points 50 may also be considered points wherein force is applied in a general direction by the hand of an individual on a vector or vector force 49. A plane 51 is defined as substantially perpendicular the force vector 49. To securely grip the handle 30 or grasping points 50, the hand, or fingers of the hand, of an individual will typically break the plane 51, as illustrated by a line 53, in at least two place when encircling, such as by more than 180 degrees, the grasping point 50. This secure grip encirclement by the hand, or fingers of the hand, will generally be achieved on the side of the plane 51 opposite the force vector 49, such as illustrated by the line 53. In other embodiments, to securely grip the handle 30 may include encirclement by 270 degrees or more of the hand or fingers or the hand. In other embodiments (not shown), the handle 30 and/or grasping points 50 may be provided as knobs or other devices or structures coupled at various locations about the body portion 12 to promote insertion and removal of the test paddle 10.

Figure 4:
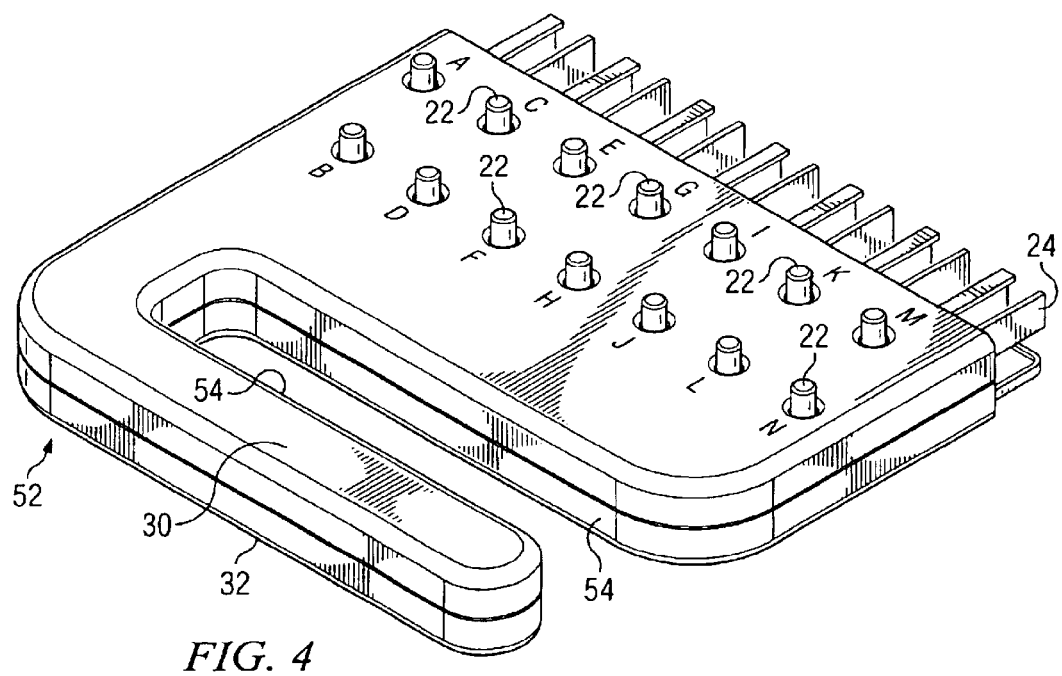
FIG. 4 is a perspective view of the test paddle illustrating yet another embodiment of the handle for grasping the test paddle.

Referring also to FIG. 4, another embodiment of the handle 30 is shown where the second end 32 of the body portion 12 defines the handle 30 to form a U-shaped handle 30 for grasping the test paddle 10. The handle 30, in other embodiments, may also extend vertically (not shown), or perpendicular to the upper surface 14, in contrast to the horizontal disposition illustrated in the present embodiment. In still other embodiments, the second end 32 may lip back toward the first end 26 of the body portion 12. As such, the lip configuration of the second end 32 may be thought of as an arching or box U-shape for grasping the test board 10.

Due to the difficulty inserting and removing test boards from relays, the various handles 30 illustrated in the present disclosure provide a simple, but effective way to reduce or overcome this problem. The handle 30 may be easily grasped since this configuration promotes improved access to the handle 30 regardless of the position of the test paddle 10.

It will be appreciated that a number of configurations of the second end 32 or other portions of the body portion 12 may be employed for grasping by the hand of an individual user to promote insertion and removal of the test paddle 10. The present disclosure, while illustrating a number of configurations of the handle 30, should not be limited to the disclosed configurations since other shapes and designs with readily suggest themselves to one skilled in the art.

The test paddle 10 may be provided as a ten or fourteen pole test paddle, that is, having either ten studs 22 coupled to ten contacts 24 or fourteen studs 22 coupled to fourteen contacts 24, or as otherwise necessary based on the particulars of the relay to be tested. In the present embodiment, the edges 54 about the upper and lower surfaces 14 and 16 of the body portion 12 have been knurled or beveled. This promotes grasping the handle 30 more securely and comfortably since this design conforms to the hand of an individual better than a non-beveled edge 54. One of skill in the art will recognize that similar approaches may be used to improve grips on other shapes, specifically including the handles disclosed herein and other handles.

FIG. 5 illustrates one embodiment of a binding post 60 for connection to the studs 22 of the test paddle 10. The binding post 60 includes a cover 62 which may be a substantially solid member constructed, for example, from a non-conductive or insulating material, or plastic or polymeric materials such as ABS Plastic. The cover 62 may be a substantially cylindrical or hexed-shaped member having an inner chamber 64 extenting from a first end 66 to a second end 68 of the cover 62.

An outer surface 70 of the cover 62 may be configured, as previously discussed, such that at least a portion of the outer surface 70 of the cover 62 is hex shaped for receiving a tool or otherwise configured to promote rotation of the cover 62. Although a hex shape is shown in this illustration, a box or other shaped outer surface 70 may be employed as well.

The binding post 60 further includes an insert 72 provided with a shaft 74 having a first end 76 and a second end 78. The insert 72 further includes a shoulder 80 coupled to the first end 76 of the shaft 74. The insert 12 and shoulder 80 may be constructed from any conductive material, however in some embodiments, brass may be preferable. The shaft 74 is configured in a hex shape, although other shapes may be utilized as well, to be received by the inner chamber 64 of the cover 62. For example, the inner chamber 64 may be configured in a hex shape extending from the first end 66 to the second end 68 of the cover 62 to matingly receive the hex-shaped shaft 74 of the insert 72.

The first end 76 of the shaft 74 and a portion of the shoulder 80 define an opening 82. In the illustrated embodiment, the opening 82 is threaded for threadingly engaging the insert 72 to the stud 22 to secure the binding post 60 to the test paddle 10. The opening 82 may, in other embodiments, be configured for tensioning or other engagements of the binding post 60 to the studs 22, which will suggest themselves to one skilled in the art.

When the insert 72 is positioned within the inner chamber 64 of the cover 62, by rotating the cover 62, a rotation is effected on the insert 72 as well. This configuration promotes threading or otherwise connecting the binding post 60 to the test paddle 10 without contacting the insert 72. The cover 62 and the insert 72 may be independently constructed and subsequently assembled, as illustrated. In other embodiments however, the binding post 60 may be constructed such that the insert 72 and cover 62 are constructed of similar materials and are substantially unitary or integral.

In this embodiment, the insert 72 is provided with an annular recess 84 extending circumferentially about a portion of the shaft 74. A ring 86 extends about a portion of the inner chamber 64 of the cover 62 and is configured such that the ring 86 is received into the annular recess 84 when the insert 72 is disposed in the inner chamber 64. Thus, the ring 86 of the cover 62 engages the annular recess 84 of the insert 72 to retain the insert 72 within the inner chamber 64 of the cover 62 and to inhibit unintentional removal of the insert 72 from the cover 62.

Referring also to FIG. 6, a top view of the binding post 60 is provided that illustrates the second ends 68 and 78 of the cover 62 and the insert 72, respectively. A lower cylindrical portion 90 is shown having a slightly larger diameter than the hex shape upper portion 92 of the cover 62. The inner chamber 64 provides a gap between the cover 62 and the insert 72 wherein a sleeve 94, or other insulating barrier, may be provided.

The second end 78 of the shaft 74 defines an opening 96 configured to receive a banana jack or other coupling for electrically connecting test equipment, for example. Banana jacks (not shown) are frequently used as a coupling for connecting electrical or test equipment for these purposes. Banana jacks may be provided with a safety or sleeve, to prevent the banana jack from accidentally contacting other conductive surfaces.

In this embodiment, the sleeve 94 is provided to cooperate with a safety banana jack so that a plug of the banana jack is received in the opening 96 in the second end 78 of the shaft 74. In this manner, the safety or sleeve portion of the banana jack is fitted into the inner chamber 64 between the second end 68 of the cover 62 and the second end 78 of the shaft 74 of the insert 72. In other embodiments, the sleeve 94 is not used or may be removable.

As discussed above, the inner chamber 64 is hex shaped about the first end 66 (see FIG. 5) of the cover 62 to receive, for example, the hex shape shaft 74. The inner chamber 64 may be of a greater diameter and generally round in shape about the second end 68 of the cover 62. In this manner, the inner chamber 64 near the first end 66 is provided to retain and couple with the insert 72 while the inner chamber 64 near the second end 68 has a larger opening sized to provide a gap to promote coupling of the banana jack or other connector with the shaft 74 of the insert 72.

FIG. 7 is a perspective view of one embodiment of the binding post 60 illustrating the insert 72 provided in the inner chamber 64 of the cover 62. This view illustrates that the shoulder 80 abuts the first end 66 of the cover 62 when the insert 72 is provided in the inner chamber 64 of the cover 62. When testing switches in relays, test equipment may require coupling for testing purposes using, for example, banana jacks or other connectors, spade or ring lugs, stripped, bare or coated wire.

A spade lug is essentially a flat piece of conductive material, such as steel or brass, in a U-shape for coupling about an electrical post, such as the stud 22. A ring lug is essentially a flat, washer-shaped, piece of conductive material with a ringed opening for coupling about an electrical post, such as the stud 22. When connecting test equipment, it may be necessary to adjust the position of the binding post 60 on the test paddle 10 for connecting devices such as spade or ring lugs.

Referring also to FIG. 8, a plurality of binding posts 60 are illustrated coupled to studs 22 on the upper surface 14 of the test paddle 10. As previously discussed in the illustrated embodiment, the threaded opening 82 of the insert 72 is threaded to the stud 22 for connecting the binding post 60 to the test paddle 10. Once screwed into place, the shoulder 80 is brought into engagement about the upper surface 14 of the body portion 12 of the test paddle 10.

The generic configuration of the cover 62 allows engagement by a number of common tools or by grasping the cover 62 by hand. By rotating the binding post 60, via the cover 62, the shaft 74 also rotates to loosen or tighten the binding post 60 to the threaded portion of the stud 22. By loosening the binding post 60 as described above, a connection, such as a spade lug 98 or stripped wire, may be positioned between the shoulder 80 of the binding post 60 and the upper surface 14 of the test paddle 10. Tightening the binding post 60 on the stud 22 brings the spade lug 98 into electrical communication with the stud 22, as well as and the respective contact 24. When the test paddle 10 is connected to a relay, any electrical test equipment connected to the lug 98 is also electrically coupled for testing a particular switch of the relay.

The binding post 60 may be completed unscrewed from the stud 22 for positioning a ring lug over the stud and thereafter re-threading the binding post 60 to the stud 22. Thus, the binding post 60 is readily adapted for coupling spade and ring lugs, for example, for testing and other purposes, to the test paddle 10.

As previously discussed, a banana jack 100 may also be coupled to the second end 68 of the cover 62, substantially as illustrated, by plugging the coupling portion of the banana jack into the opening 96 provided on the second end 78 of the shaft 74. Since the cover 62 of the binding post 60 is constructed of insulated or non-conductive material, there is reduced concern for accidental electrical shock or other inadvertent electrical hazard when working with the binding post 60. Also, as the cover 62 becomes worn, the old cover 62 can be removed and a new cover 62 can easily be snapped over the insert 72, in some embodiments.

In the illustrated embodiment, the diameter of the shoulder 80 may be greater than the diameter of the shaft 74 to promote a tension connection and to promote electrical communication between the spade lug, ring lug, or other connection to the test paddle 10 and testing device.

Thus, it is apparent that there has been provided, in one or more embodiments, a test paddle having a universal binding post that satisfies one or more of the advantages set forth above. Although the preferred embodiment has been described in detail, it should be understood that various changes, substitutions, and alterations can be made herein without departing from the scope of the present disclosure, even if all of the advantages identified above are not present. For example, the various elements or components may be combined or integrated in another system or certain features may not be implemented.

Also, the components, techniques, systems, sub-systems, layers, compositions and methods described and illustrated in the preferred embodiment as discrete or separate may be combined or integrated with other components, systems, modules, techniques, or methods without departing from the scope of the present disclosure. Other examples of changes, substitutions, and alterations are readily ascertainable by one skilled in the art and could be made without departing from the spirit and scope as disclosed herein.

What is claimed is:

1. A test device connectable to a relay and connectable to test equipment to test the relay, the test device comprising:
   a test paddle having:
      a body portion having a stud opening and a contact opening,
      a stud extending through the stud opening,
      a contact extending through the contact opening and electrically coupled to the stud, and
      a handle configured for grasping by the hand of an individual and provided to promote insertion and removal of the test paddle from the relay; and
   a binding post having:
      a cover having an inner chamber and an outer surface configured to promote rotation of the cover, and
      an insert having a shaft coupleable to the inner chamber of the cover, the first end of the shaft configured to couple with the stud on the test paddle.

2. The test device of claim 1, wherein the body portion includes a plurality of stud openings and a plurality of contact openings and wherein the test device further comprising a plurality of studs extending through the plurality of stud openings and a plurality of contacts extending through the plurality of contact openings, each of the plurality of contacts electrically coupled to one of the studs.

3. The test device of claim 2, wherein a barrier extends from the body to inhibit electrical communication between the plurality of contacts and relays other than the relay under test.

4. The test device of claim 3, further comprising a plurality of binding posts and wherein the inserts of the plurality of binding posts are disconnectable from the respective studs.

5. The test device of claim 1, wherein the inner chamber of the cover of the binding post extends through the cover of the binding post from a first end to a second end of the cover of the binding post and wherein a second end of insert is operable to couple to a banana jack.

* * * * *